(12) United States Patent
Snyder et al.

(10) Patent No.: US 6,784,035 B2
(45) Date of Patent: Aug. 31, 2004

(54) FIELD EFFECT TRANSISTOR HAVING SOURCE AND/OR DRAIN FORMING SCHOTTKY OR SCHOTTKY-LIKE CONTACT WITH STRAINED SEMICONDUCTOR SUBSTRATE

(75) Inventors: John P. Snyder, Edina, MN (US); John M. Larson, Northfield, MN (US)

(73) Assignee: Spinnaker Semiconductor, Inc., Eden Prairie, MN (US)

( * ) Notice: Subject to any disclaimer, the term of this patent is extended or adjusted under 35 U.S.C. 154(b) by 0 days.

(21) Appl. No.: 10/342,590

(22) Filed: Jan. 15, 2003

(65) Prior Publication Data

US 2003/0139001 A1 Jul. 24, 2003

Related U.S. Application Data

(60) Provisional application No. 60/351,114, filed on Jan. 23, 2002, provisional application No. 60/319,098, filed on Jan. 25, 2002, and provisional application No. 60/381,320, filed on May 16, 2002.

(51) Int. Cl.[7] .............................................. H01L 21/338
(52) U.S. Cl. ...................... 438/167; 438/285; 438/590; 438/199; 438/153; 438/752; 257/19; 257/192; 257/194; 257/369; 257/351; 257/616; 257/20
(58) Field of Search ................................ 438/167, 285, 438/590, 199, 153, 752; 257/19, 192, 194, 369, 351, 616, 20

(56) References Cited

U.S. PATENT DOCUMENTS

| | | | |
|---|---|---|---|
| 4,513,309 A | | 4/1985 | Cricchi |
| 4,554,569 A | | 11/1985 | Tove et al. |
| RE32,613 E | * | 2/1988 | Lepselter et al. ........... 438/571 |
| 5,040,034 A | | 8/1991 | Murakami et al. |
| 5,250,834 A | | 10/1993 | Nowak |
| 5,361,225 A | | 11/1994 | Ozawa |
| 5,663,584 A | * | 9/1997 | Welch ........................ 257/288 |
| 5,665,993 A | | 9/1997 | Keller et al. |
| 5,891,769 A | * | 4/1999 | Liaw et al. .................. 438/167 |
| 6,096,590 A | | 8/2000 | Chan et al. |
| 6,153,484 A | * | 11/2000 | Donaton et al. ............ 438/301 |
| 6,255,227 B1 | * | 7/2001 | Donaton et al. ............ 438/745 |
| 6,303,479 B1 | * | 10/2001 | Snyder ........................ 438/581 |
| 2002/0125471 A1 | * | 9/2002 | Fitzgerald et al. ............ 257/19 |
| 2003/0057416 A1 | * | 3/2003 | Currie et al. .................. 257/19 |

FOREIGN PATENT DOCUMENTS

| | | |
|---|---|---|
| JP | 06097109 | 4/1994 |
| JP | 2000124329 | 4/2000 |
| WO | WO 01/45157 A1 | 6/2001 |

OTHER PUBLICATIONS

Magnusson, U. et al. "Bulk Silicon Technology For Complementary MESFETs." *Electronics Letters*, vol. 25, No. 9, Apr. 27, 1989; pps. 565–566.

\* cited by examiner

*Primary Examiner*—Matthew Smith
*Assistant Examiner*—Victor V Yevsikov
(74) *Attorney, Agent, or Firm*—Dorsey & Whitney LLP

(57) ABSTRACT

The present invention is a field effect transistor having a strained semiconductor substrate and Schottky-barrier source and drain electrodes, and a method for making the transistor. The bulk charge carrier transport characteristic of the Schottky barrier field effect transistor minimizes carrier surface scattering, which enables the strained substrate to provide improved power and speed performance characteristics in this device, as compared to conventional devices.

35 Claims, 3 Drawing Sheets

FIG. 1 – PRIOR ART

FIELD EFFECT TRANSISTOR HAVING SOURCE AND/OR DRAIN FORMING SCHOTTKY OR SCHOTTKY-LIKE CONTACT WITH STRAINED SEMICONDUCTOR SUBSTRATE

CROSS-REFERENCE TO RELATED APPLICATION(S)

The present application claims priority to U.S. provisional patent application 60/351,114, filed Jan. 23, 2002, U.S. provisional patent application 60/319,098, filed Jan. 25, 2002, and U.S. provisional patent application 60/381,320, filed May 16, 2002, all of which are incorporated herein by reference in their entirety.

BACKGROUND OF THE INVENTION

The present invention relates to devices for regulating the flow of electric current, and has specific application to the fabrication of these devices in the context of an integrated circuit ("IC"). More particularly, it relates to a transistor for regulating the flow of electric current having a Schottky-barrier source and/or drain.

One type of field effect transistor ("FET") known in the art, a metal oxide semiconductor field effect transistor ("MOSFET"), is shown in FIG. 1. As shown, the MOSFET device 100, typically includes a silicon substrate 110, an impurity doped source 120, and an impurity doped drain 130, separated by a channel region 140. Atop the channel region 140 is a gate insulating layer 150, which typically consists of silicon dioxide. A gate electrode 160, made from electrically conductive material, is located on top of the insulating layer 150. An insulating layer 170 typically surrounds the gate electrode 160. A field oxide 180 electrically isolates devices 100 from one another. When an appropriate voltage $V_g$ is applied to the gate electrode 160, current flows between the source 120 and drain 130 through the channel region 140. This current is referred to as the drive current, or $I_d$.

One consideration in the design of current regulating devices is the charge carrier mobility or ease with which charge carriers (i.e., electrons or holes) travel through the substrate lattice in the channel region 140. From conventional MOSFET theory, drive current scales linearly with carrier mobility. Channel regions 140 that have higher charge carrier mobilities allow charge carriers to travel in less time between the source 120 and the drain 130, and also to dissipate less power in the carrier transport process. This directly results in devices operating at higher speeds and consuming less power. One known technique for increasing the charge carrier mobility of the channel region 140 is to employ a strained substrate. For example, the mobilities of electrons and holes in strained silicon can be enhanced by factors of approximately two and ten respectively, compared to unstrained silicon. (M. V. Fischetti, S. E. Laux, Journal of Applied Physics, vol. 80 no. 4, 15 Aug. 1996, pp. 2234–52.) As a result, MOSFET devices with strained silicon channel regions 140 are expected to demonstrate power and speed performance characteristics superior to conventional, unstrained silicon devices.

Another known substrate used to fabricate MOSFET devices is a silicon-on-insulator ("SOI") substrate. This semiconductor substrate includes a buried oxide layer to reduce source-to-drain leakage currents and parasitic capacitances. The prior art includes fabrication of MOSFET devices on a semiconductor substrate having a strained SOI layer. (B. Metzger, "Silicon Takes the Strain for RF Applications," Compound Semiconductor, vol. 7, no. 7, August 2001; T. Mizuno, "Design for Scaled Thin Film Strained-SOI CMOS Devices with Higher Carrier Mobility," IEDM Proceedings, December 2002, p. 31.)

Experimental results, however, for MOSFETs having impurity doped sources and drains and strained silicon channels, show that the devices do not fully benefit from the improvement in carrier mobility. For example, in one study, a 70% improvement in electron mobility led to only a 35% improvement in drive current. (K. Rim, S. Koester, M. Hargrove, J. Chu, P. M. Mooney, J. Ott, T. Kanarsky, P. Ronsheim, M. Ieong, A. Grill, H.-S. P. Wong, Proceedings of the 2001 IEEE VLSI Symposium, Kyoto, Japan (2001).) Because drive current scales linearly with mobility, the net improvement of 35% in drive current implies that the effective mobility for electrons only improved 35% for this example.

There is a need in the art for a FET having a strained substrate, demonstrating an improvement in effective mobility, and therefore improvement in drive current closer to that of the improvement in carrier mobility.

BRIEF SUMMARY OF THE INVENTION

The present invention, in one embodiment, is a FET having a Schottky-barrier source and/or drain and a strained semiconductor substrate. In this embodiment, the device includes a strained semiconductor substrate. A source electrode and a drain electrode are in contact with the strained substrate, and at least one of the electrodes forms a Schottky or Schottky-like contact with the substrate. The source and drain electrodes are separated by a channel. An insulating layer is disposed on the strained substrate above the channel. A gate electrode is disposed on the insulating layer.

The present invention, in another embodiment, is a method of fabricating a Schottky-barrier FET on a strained semiconductor substrate. In this embodiment, the method includes providing a strained semiconductor substrate. It further includes providing an electrically insulating layer in contact with the strained substrate. The method further includes providing a gate electrode on the insulating layer such that the substrate on one or more areas proximal to the gate electrode is exposed. The method further includes depositing a thin film of metal and reacting the metal with the exposed strained substrate, such that Schottky or Schottky-like source and drain electrodes are formed on the substrate.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION

Figure 2:
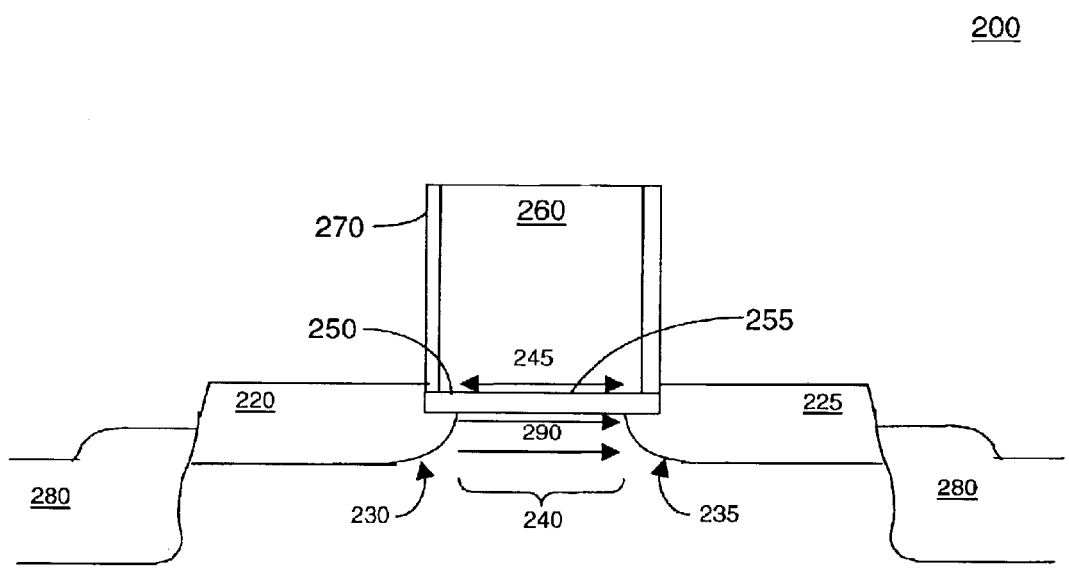
FIG. 2 is a sectional view of a Schottky-barrier field effect transistor ("FET"), with a strained substrate, according to one embodiment of the present invention.

FIG. 2 shows a Schottky-barrier FET device 200. The device 200 includes a semiconductor substrate 210 in which a source 220 and drain 225 are formed, separated by a channel 240. The substrate 210 is strained. In one embodiment, the substrate consists of strained silicon. In other embodiments, other strained semiconducting materials are used. For example, in one embodiment, the device is fabricated on a strained SOI substrate. This embodiment provides both the advantage of improved carrier mobility and reduced source to drain leakage and parasitic capacitive coupling.

In one embodiment, the source 220 or the drain 225 (or both) are composed partially or fully of a metal silicide. Because the source 220 and/or the drain 225 are composed in part of a metal, they form Schottky contacts or Schottky-like regions 230, 235 with the substrate 210. A "Schottky contact" is defined by the contact between a metal and a semiconductor, and a "Schottky-like region" is a region formed by the close proximity of a semiconductor and a metal. The Schottky contacts or Schottky-like regions 230, 235 can be formed by forming the source 220 or the drain 225 from a metal silicide. In one embodiment of the present invention, the source 220 or the drain 225 (or both) are composed partially or fully of Platinum Silicide, Palladium Silicide, Iridium Silicide, or a rare earth silicide.

The Schottky contacts or Schottky-like regions 230, 235 are in an area adjacent to the channel region 240 formed between the source 220 and drain 225. In one embodiment of the present invention, the channel region 240 is impurity doped, using a conventional non-uniform doping profile, such as a halo implant for example. In another embodiment, the doping profile varies significantly in the vertical direction and is generally constant in the lateral direction, as described in commonly-assigned, U.S. Pat. No. 6,303,479 B1 ("the '479 patent"), and U.S. Pat. No. 6,495,882 ("the '882 patent"), which are hereby incorporated by reference in their entirety. The particular doping profile used in the device is not critical to the present invention.

An insulating layer 250 is located on top of the channel region 240. The insulating layer 250 is composed of a material such as silicon dioxide, or any other electrically insulating material. In one embodiment of the present invention, a material having a high dielectric constant (i.e., high K) is used as the insulating layer 250. Examples of high K materials are those materials having dielectric constants greater than that of silicon dioxide, including for example metal oxides such as $TiO_2$. The use of a high K gate insulating layer in combination with a Schottky-barrier device results in additional improvements in drive current, as explained in copending U.S. patent application Ser. Nos. 09/928,124 and 09/928,163, both filed on Aug. 10, 2001, both of which are hereby incorporated by reference in their entirety. Another embodiment is a Schottky-barrier FET fabricated on a strained SOI substrate and including a high K gate insulating layer. Another embodiment of the present invention includes both a high K gate insulating layer and a generally constant lateral doping profile (as set forth in the '479 patent), in combination with a strained silicon, Schottky-barrier device. Yet another embodiment is a Schottky-barrier device fabricated on a strained SOI substrate, including a high K gate insulating layer, and the generally constant lateral doping profile as set forth in the '479 patent.

A gate electrode 260 is positioned on top of the insulating layer 250, and a thin insulating layer 270 is provided on one or more gate sidewalls the gate electrode 260. The gate electrode 260 may be doped poly silicon, a metal, or any electrically conductive material. A field oxide 280 electrically isolates devices from one another.

The principles of the present invention are applicable to a device constructed on any variety of strained semiconductor substrates known in the art. By way of example, however, according to one embodiment of the present invention, the strained semiconductor is constructed as follows. A first strained semiconductor layer 210 such as silicon, is deposited on top of a second layer 205 such as silicon germanium, such that the lattice mismatch between the first strained semiconductor layer 210 and the second layer 205 causes strain in the first layer 210. In one embodiment, the second layer 205 is a thin film. In another embodiment, the thin film 205 is deposited on a substrate 215 such as silicon. Other embodiments of the present invention are directed to Schottky-barrier devices constructed on other known strained silicon substrates.

Figure 1:
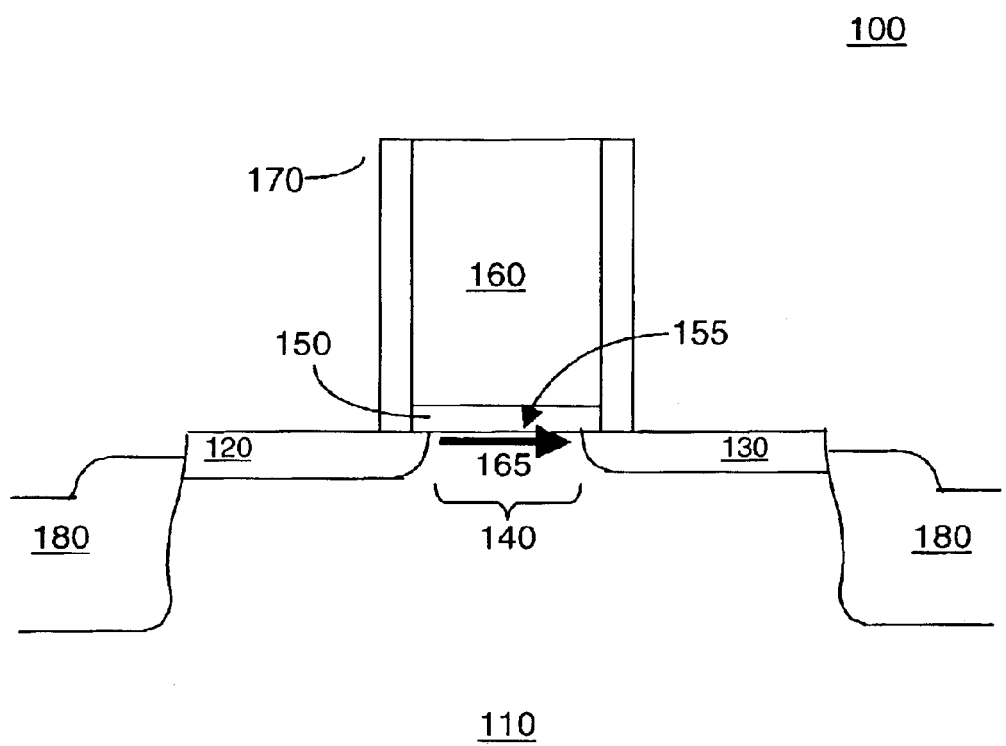
FIG. 1 is a sectional view of a metal oxide semiconductor field effect transistor ("MOSFET"), as known in the prior art.

A conventional FET is, necessarily, a surface conduction device. As shown in FIG. 1, carriers 165 leave the source 120 and traverse the channel region 140, during which time the carriers 165 experience a strong attraction to an interface 155 defined by the contact plane between the substrate 110 and the gate insulating layer 150. The carriers 165 typically experience many surface scattering events due to roughness of the interface 155. The surface scattering phenomena substantially degrades the carriers' mobility in the channel region 140, resulting in a lower effective carrier mobility. The significant shortfall in performance enhancement for conventional FETs using a strained silicon substrate is caused by surface scattering of charge carriers 165 at the interface 155.

On the other hand, in the Schottky-barrier FET device 200, carriers 290 are field emitted from the source 220 in an initial direction normal to the surface of the metallic source 220. They traverse the channel 240 largely in bulk silicon, not along an interface 255 defined by the contact plane between the strained substrate 210 and the insulating oxide 250. Accordingly, carriers 290 experience far fewer scattering events caused by surface roughness at the interface 255, resulting in an effective carrier mobility improvement closer to the two-fold and ten-fold improvement observed in bulk silicon for electrons and holes respectively. The distance between the source 220 and drain 225 is denoted as channel length 245. The improvement in effective carrier mobility increases as the channel length 245 of the device 200 is reduced.

Figure 3:
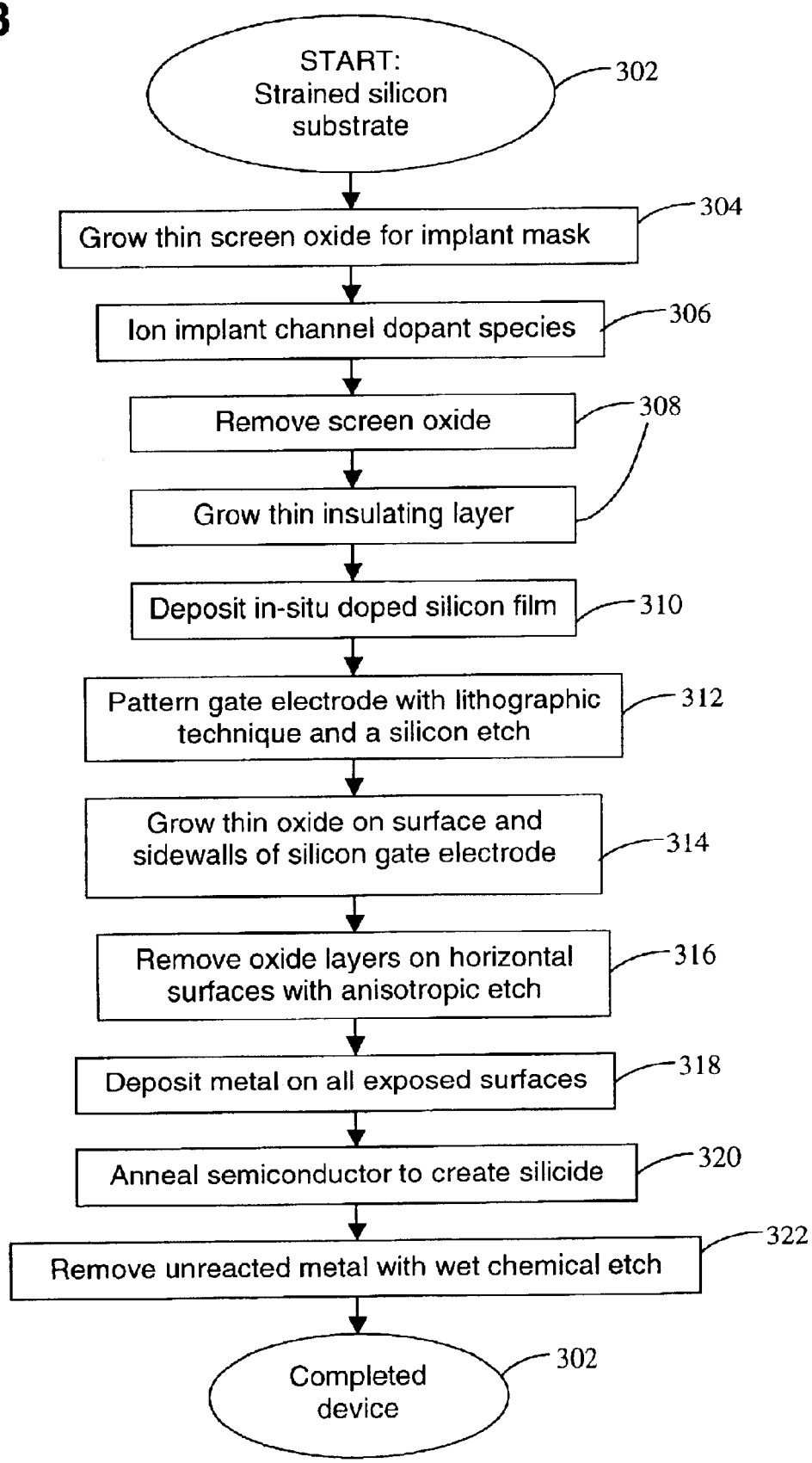
FIG. 3 is a flowchart showing a strained Schottky-barrier FET fabrication method, according to one embodiment of the present invention.

FIG. 3 shows a fabrication method for a Schottky-barrier FET according to one embodiment of the present invention. As shown in FIG. 3 the method begins with a silicon substrate, which is strained (block 302). A thin screen oxide is grown (in one embodiment, approximately 200 Å) to act as an implant mask (block 304). The appropriate channel dopant species (for example Arsenic and Boron for P-type and N-type devices, respectively) is then ion-implanted through the screen oxide to a pre-determined depth in the silicon (block 306).

The screen oxide is then removed, and a thin gate oxide (in one embodiment, approximately 35 Å) is grown (block 308). The gate oxide growth is immediately followed by an in-situ doped silicon film (block 310). The film is heavily doped with, for example, Phosphorous for an N-type device and Boron for a P-type device. Using lithographic techniques and a silicon etch that is highly selective to oxide, the gate electrode is patterned (block 312). Then, a thin oxide (in one embodiment, approximately 100 Å) is thermally grown on the top surface and sidewalls of the silicon gate electrode (block 314). An anisotropic etch is then used to remove the oxide layers on the horizontal surfaces (and thus expose the silicon), while preserving them on the vertical surfaces (block 316). Following these steps, a sidewall oxide is formed, and the dopants both in the gate electrode and in the channel region of the device are electrically activated.

Next, an appropriate metal (for example, Platinum for the P-type device and Erbium for the N-type device) is deposited as a blanket film (in one embodiment, approximately 400 Å) on all exposed surfaces (block 318). The wafer is then annealed for a specified time at a specified temperature so that, at all places where the metal is in direct contact with the silicon, a chemical reaction takes place that converts the metal to a metal silicide (block 320). For example, in one embodiment, platinum silicide is formed at a maximum temperature between about 400° C. and about 500° C. for less than about 60 minutes. In another embodiment, erbium silicide is formed at a maximum temperature between about 400° C. and about 600° C. for less than about one minute. The metal that was in direct contact with a non-silicon surface is left unaffected. A wet chemical etch (aqua regia for Platinum, $HNO_3$ for Erbium) is then used to remove the unreacted metal while leaving the metal-silicide untouched (block 322). The strained Schottky-barrier FET device is now complete and ready for electrical contacting to gate, source, and drain.

The source and drain electrodes of a conventional FET are, necessarily, formed by processes having temperatures exceeding 800C. It is known in the art that high temperature manufacturing steps—that is, steps using temperatures greater than 800° C.—may modify and/or degrade the properties of new materials introduced for improving the performance of FET devices. Examples of new materials include strained semiconductor substrates and high K gate insulators. For instance, processing a strained semiconductor substrate at a high temperature may relax the strain layer, thereby decreasing the improvement to charge carrier mobility in the strained semiconductor substrate.

On the other hand, during the Schottky-barrier FET fabrication process, the source and drain electrodes are formed by a silicide reaction process having temperatures significantly less than those used during a conventional impurity doped source and drain MOSFET device fabrication process, as explained in U.S. provisional patent application 60/381,320, filed May 16, 2002. More specifically, the silicide reacting step used to form the Schottky or Schottky-like source and drain regions of the present invention may be less than 800° C., as detailed above. Accordingly, strained silicon substrates and high K gate insulators can be integrated with a Schottky barrier FET manufacturing process without degradation of the strained silicon and/or high K gate insulator properties.

This process is only one possible way to achieve strained, metal source/drain Schottky FET devices. One skilled in the art will recognize that many other variants and alternatives exist. For example, various steps in the described process could be replaced by equivalent steps known to those in the art. Likewise, one or more of the various steps could be omitted from the fabrication process. In one embodiment of the present invention, the fabrication method includes fabrication of the strained silicon substrate. As further described above, in one exemplary embodiment, this is accomplished by depositing a layer of silicon on top of a layer of material having a larger lattice structure (such as silicon germanium). This strained silicon substrate is then processed in the manner set forth above. Many other techniques for fabricating a strained silicon substrate are known in the art and could be used in combination with the teachings of the present invention. For example, in one embodiment, a strained silicon substrate is fabricated on an oxide insulator, resulting in a strained SOI substrate, as described in the Compound Semiconductor article.

By using the techniques of the present invention, the power and speed performance of a transistor, such as a FET, can be substantially improved. Although the present invention has been described with reference to preferred embodiments, persons skilled in the art will recognize that changes may be made in form and detail without departing from the spirit and scope of the invention. For example, while many of the embodiment have been described with reference to a FET device, other transistor-type devices could also employ the techniques of the present invention.

All references cited above are hereby incorporated by reference in their entirety. Although the present invention has been described with reference to preferred embodiments, persons skilled in the art will recognize that changes may be made in form and detail without departing from the spirit and scope of the invention.

We claim:

1. A device for regulating the flow of electric current, the device comprising:

a strained semiconductor substrate;

a gate electrode on the strained semiconductor substrate; and a source electrode and a drain electrode in contact with the strained semiconductor substrate, at least one of the source electrode and the drain electrode forming a Schottky or Schottky-like contact with the strained semiconductor substrate, the source and the drain separated by a channel.

2. The device of claim 1 wherein the source electrode and the drain electrode are formed from a member of the group consisting of: Platinum Silcide, Palladium Silicide, and Iridium Silicide.

3. The device of claim 1 wherein the source electrode and the drain electrode are formed from a member of the group consisting of the rare-earth silicides.

4. The device of claim 1 wherein at least one of the source and drain electrodes forms a Schottky or Schottky-like contact with the strained semiconductor substrate at least in areas adjacent to the channel.

5. The device of claim 1 wherein an entire interface between at least one of the source and the drain electrodes and the strained semiconductor substrate forms a Schottky contact or Schottky-like region with the strained semiconductor substrate.

6. The device of claim 1 wherein the channel has channel dopants.

7. The device of claim 6 wherein a channel dopant concentration varies significantly in the vertical direction and is generally constant in the lateral direction.

8. The device of claim 6 wherein the channel dopants are selected from the group consisting of: Arsenic, Phosphorous, Antimony, Boron, Indium, and Gallium.

9. The device of claim 1 or 7 wherein the channel length is less than or equal to about 100 nm.

10. The device of claim 1 wherein the gate electrode comprises:

a gate insulator including an electrically insulating layer disposed on the strained semiconductor substrate; and a conducting film on the insulating layer.

11. The device of claim 10 wherein the gate electrode further comprises a gate sidewall spacer comprising at least one sidewall insulating layer on at least one sidewall of the gate electrode.

12. The device of claim 10 wherein the gate insulator has a dielectric constant greater than 4.0.

13. The device of claim 12 wherein the channel has channel dopants.

14. The device of claim 13 wherein a channel dopant concentration varies significantly in the vertical direction and is generally constant in the lateral direction.

15. The device of claim 1 or 13 wherein the strained semiconductor substrate is a strained SOI substrate.

16. The device of claim 10, wherein the gate insulator is formed from a member of the group consisting of metal oxides.

17. The device of claim 1 wherein the device is a MOSFET.

18. A method of manufacturing a device for regulating the flow of electric current, the method comprising:

providing a strained semiconductor substrate;

providing a gate electrode on the strained semiconductor substrate; and providing a source electrode and a drain electrode in contact with the strained semiconductor substrate, at least one of the source electrode and the drain electrode forming a Schottky or Schottky-like contact with the strained semiconductor substrate, the source and the drain separated by a channel.

19. The method of claim 18 wherein the source electrode and the drain electrode are formed from a member of the group consisting of: Platinum Silicide, Palladium Silicide, and Iridium Silicide.

20. The method of claim 18 wherein the source electrode and the drain electrode are formed from a member of the group consisting of the rare-earth suicides.

21. The method of claim 18 wherein at least one of the source and drain electrodes forms a Schottky or Schottky-like contact with the strained semiconductor substrate at least in areas adjacent to the channel.

22. The method of claim 18 wherein an entire interface between at least one of the source and the drain electrodes and the strained semiconductor substrate forms a Schottky contact or Schottky-like region with the strained semiconductor substrate.

23. The method of claim 18 further comprising the step of providing channel dopants.

24. The method of claim 23 further comprising the step of providing channel dopants such that a dopant concentration varies significantly in the vertical direction and is generally constant in the lateral direction.

25. The method of claim 18 or 24 wherein the channel length is less than or equal to about 100 nm.

26. The method of claim 23 wherein the channel dopants are selected from the group consisting of: Arsenic, Phosphorous, Antimony, Boron, Indium, and Gallium.

27. The method of claim 18 wherein the gate electrode is provided by the steps comprising:

providing a gate insulator comprising an electrically insulating layer on the strained semiconductor substrate;

providing a conducting film on the insulating layer;

patterning and etching the conducting film to form a gate electrode; and forming a gate sidewall spacer by providing at least one sidewall insulating layer on at least one sidewall of the gate electrode.

28. The method of claim 27 wherein the gate insulator has a dielectric constant greater than 4.0.

29. The method of claim 28 further comprising the step of providing channel dopants.

30. The method of claim 29 further comprising the step of providing channel dopants such that a dopant concentration varies significantly in the vertical direction and is generally constant in the lateral direction.

31. The method of claim 18 or 29 wherein the strained semiconductor substrate is a strained SOI substrate.

32. The method of claim 27, wherein the gate insulator is formed from a member of the group consisting of metal oxides.

33. The method of claim 18 or 27 further comprising the steps:

exposing at least one portion of the strained semiconductor substrate proximal to the gate electrode;

depositing a thin film of metal on the strained semiconductor substrate; and reacting the metal with the exposed portion, such that Schottky or Schottky-like source and drain electrodes are formed on the exposed portion of the strained semiconductor substrate.

34. The method of claim 33 wherein the source and drain electrodes are formed using an anneal with a maximum temperature of less than 800° C.

35. The method of claim 18 wherein the device is a MOSFET.

* * * * *